US012757504B2

(12) United States Patent
Gregory et al.

(10) Patent No.: US 12,757,504 B2
(45) Date of Patent: Oct. 6, 2026

(54) MULTIBAND FOCAL PLANE ARRAY (FPA) ENABLED BY THE COMBINATION OF MICROBOLOMETER AND COLLOIDAL QUANTUM DOT SHORT WAVE INFRARED (SWIR) DETECTORS ON A SINGLE READOUT INTEGRATED CIRCUIT (ROIC)

(71) Applicant: SWIR Vision Systems Inc., Durham, NC (US)

(72) Inventors: Christopher William Gregory, Chapel Hill, NC (US); Ethan J.D. Klem, Chapel Hill, NC (US); Jeffery Allan Hilton, Jr., Durham, NC (US)

(73) Assignee: SWIR Vision Systems, Inc., Scottsdale, AZ (US)

( * ) Notice: Subject to any disclaimer, the term of this patent is extended or adjusted under 35 U.S.C. 154(b) by 212 days.

(21) Appl. No.: 18/751,970

(22) Filed: Jun. 24, 2024

(65) Prior Publication Data

US 2024/0429262 A1 Dec. 26, 2024

Related U.S. Application Data

(60) Provisional application No. 63/509,868, filed on Jun. 23, 2023.

(51) Int. Cl.
*H10F 39/00* (2025.01)
*H10F 39/18* (2025.01)

(52) U.S. Cl.
CPC ......... *H10F 39/184* (2025.01); *H10F 39/014* (2025.01); *H10F 39/806* (2025.01)

(58) Field of Classification Search
CPC ......... H01L 27/14649; H01L 27/14625; H01L 27/14689; H10F 39/014; H10F 39/184; H10F 39/1847
See application file for complete search history.

(56) References Cited

U.S. PATENT DOCUMENTS

| | | | | |
|---|---|---|---|---|
| 9,117,722 | B1 * | 8/2015 | Koenck | H10F 71/10 |
| 9,741,761 | B2 * | 8/2017 | Jiang | H10F 39/8033 |
| 9,911,781 | B2 * | 3/2018 | Haddad | H10F 39/8067 |
| 2012/0161001 | A1 * | 6/2012 | Bornfreund | H10F 39/011<br>438/54 |
| 2013/0075699 | A1 * | 3/2013 | Brown | B82Y 30/00<br>977/773 |
| 2013/0207214 | A1 * | 8/2013 | Haddad | G01J 5/20<br>257/443 |

(Continued)

OTHER PUBLICATIONS

Microbolometer—Wikipedia (Year: 2026), https://en.wikipedia.org/wiki/Microbolometer#HeroSection.*

(Continued)

*Primary Examiner* — Dani Fox
(74) *Attorney, Agent, or Firm* — Slayden Grubert Beard PLLC

(57) ABSTRACT

A multiband focal plane array (FPA) is provided including a readout integrated circuit (ROIC) substrate; a plurality of short wave infrared (SWIR) and long wave infrared (LWIR) pixels on the ROIC substrate; a microbolometer on the plurality of SWIR and LWIR pixels; and a colloidal quantum dot photodiode on the SWIR pixels between the SWIR pixels and the microbolometer. The microbolometer is coupled to the LWIR pixels through metal contacts on the LWIR pixels.

20 Claims, 5 Drawing Sheets

(56) References Cited

U.S. PATENT DOCUMENTS

| | | | | |
|---|---|---|---|---|
| 2021/0225941 | A1* | 7/2021 | Huang | H10F 39/1847 |
| 2021/0288195 | A1* | 9/2021 | Klem | H10F 39/107 |
| 2023/0033475 | A1* | 2/2023 | Lo | H10F 39/80 |
| 2025/0040265 | A1* | 1/2025 | McCarten | H10F 77/148 |

OTHER PUBLICATIONS

Microbolometers: Principles and Design Challenges Explained—ICO OPtics (Year 2026); https://www.ico-optics.org/microbolometers-principles-and-design-challenges/.*

* cited by examiner

| InGaAs Approach to Multiband FPAs | | |
|---|---|---|
| **Technical Challenge** | **Technical Risk** | **Impact to COGs** |
| **Bump Bonding:**<br>Small pitch bump bonding is required for sufficient resolution SWIR and LWIR on one FPA | **High**<br>Significant investment dollars have been allocated to small pitch bumping bonding for over 20 years, with only incremental improvement | **High**<br>The yield of small pitch bump bonding is poor |
| **Topography:**<br>Bolometers are typically fabricated on planar Si ROIC wafers. In this approach wide (mm) deep (tens or hundreds of μm) gaps will exist between the InGaAs hybridized die. | **High**<br>How does the microbolometer process deal with the planarity caused by the die-to-wafer InGaAs bonding process? | **High**<br>Complex planarizing materials and processes must be developed to handle the topography and CTE mismatch. |
| **Through InGaAs Vias:**<br>Required for microbolometers to contact ROIC. Through silicon vias are challenging. Through InGaAs vias are likely more challenging | **High**<br>InGaAs through vias have not been studied extensively for commercial markets. Maturation of through silicon vias required billions of dollars in investment. | **High**<br>Through substrate (silicon or InGaAs) vias will be very expensive. |
| **Thermal compatibility:**<br>Indium bump bonds melt at around 150C. Microbolometer release and bonding process is typically around these temperatures. | **Medium**<br>Could be solved with CuSn or other bump bond material during InGaAs hybridization | **Medium**<br>Impacts to yield of CuSn bonding? |
| **InP polishing:**<br>InP likely removed to reduce topography and make through via formation easier | **Medium?**<br>InP substrate must be removed. Polishing process for a die-to-wafer bonded device must be developed. | **Medium?**<br>Price for InGaAs vis-SWIR detectors is very expensive due to the polishing process. Suspect polishing a die-to-wafer bonded pair is more difficult than die-to-die. |

TABLE 1

FIG. 2
(PRIOR ART)

| SWIR Vision Systems CQD Approach to Multiband FPAs | | |
|---|---|---|
| **Technical Challenge** | **Technical Risk** | **Impact to COGs** |
| **Bump Bonding/hybridization:**<br>No bump bonding required | **None** | **None** |
| **Topography:**<br>CQD process will result in less than 500 nm of topography | **Very low**<br>The first polyimide layer used to fabricate bolometers will planarize the 500 nm of topography from underlying CQD photodiode. | **Little to none** |
| **Through InGaAs Vias:**<br>No through vias required | **None** | **None** |
| **Thermal compatibility:**<br>CQD material must survive ~ 150-200C process temps depending on release and wafer level vacuum packaging processes | **Medium**<br>SVS has demonstrated 200C compatibility. | **Low** |
| **InP polishing:** | **None** | **None** |
| **CQD patterning** | **Medium**<br>1. SVS has demonstrated two different pixel-level compatible patterning methods. SVS will explore both approaches as part of this program. | **Low** |

TABLE 2

FIG. 5

MULTIBAND FOCAL PLANE ARRAY (FPA) ENABLED BY THE COMBINATION OF MICROBOLOMETER AND COLLOIDAL QUANTUM DOT SHORT WAVE INFRARED (SWIR) DETECTORS ON A SINGLE READOUT INTEGRATED CIRCUIT (ROIC)

CROSS-REFERENCE TO RELATED APPLICATION

This application claims the benefit of and priority to U.S. Provisional Application No. 63/509,868, filed Jun. 23, 2024, entitled Multiband Focal Plane Array (FPA) Enabled by the Combination of Microbolometer and Colloidal Quantum Dot Short Wave Infrared Detectors on a Single Readout Integrated Circuit (ROIC), the content of which is hereby incorporated herein by reference in its entirety.

FIELD

The present inventive concept relates generally to focal plane arrays and, more particularly, to multiband focal plane arrays.

BACKGROUND

Combining short wave infrared (SWIR) and long-wave infrared (LWIR) detection capabilities into single focal plane array (FPA) and/or single aperture camera confers substantial benefits to the size, weight, power consumption, and cost of infrared imaging systems. One of challenges faced by the integration of traditional SWIR InGaAs detectors with LWIR sensitive microbolometers is the hybridization process by which the InGaAs is integrated into subsequent microbolometer fabrication process. FIG. 1 illustrates a cross-section illustrating a four-pixel indium gallium arsenide (InGaAs)/Indium Phosphorus (InP) detector die hybridized to a silicon readout wafer. The InP substrate has been removed to expose a previously formed layer through the InGaAs via. A large topography planarization process is then used to fill the large gaps between the InGaAs detector die. Microbolometers are fabricated on the backside of the eight (8) inch ROIC and InGaAs die. The microbolometers are electrically connected silicon readout using the InGaAs through vias.

To employ InGaAs detectors, the InP substrate generally must be hybridized with the silicon (Si) ROIC at relatively small pitch to provide sufficient resolution of both the long wave infrared (LWIR) and SWIR bands in a small format focal plane. This requirement exaggerates one of the leading yield loss mechanisms in the InGaAs fabrication process; short and open-circuit electrical connections due to the indium bump bonding process. The InGaAs fabrication process also generally requires InGaAs vias (i.e. through silicon vias but in InGaAs) to be formed in the InP/InGaAs arrays to interconnect the microbolometer MEMS structure to the surface of the underlying silicon (Si) ROIC. Both the through vias and indium bump bonding processes are expensive and low yielding, particularly with the coefficient of thermal expansion mismatch between the heterogeneous substrates (i.e. Si to InP). Table 1 illustrated in FIG. 2 captures in more detail the technical and cost challenges with the InGaAs approach to enable multiband detectors.

SUMMARY

Some embodiments of the present inventive concept provide a multiband focal plane array (FPA) including a readout integrated circuit (ROIC) substrate; a plurality of short wave infrared (SWIR) and long wave infrared (LWIR) pixels on the ROIC substrate; a microbolometer on the plurality of SWIR and LWIR pixels; and a colloidal quantum dot photodiode on the SWIR pixels between the SWIR pixels and the microbolometer. The microbolometer is coupled to the LWIR pixels through metal contacts on the LWIR pixels.

In further embodiments, the ROIC substrate may be a single silicon CMOS ROIC substrate.

In still further embodiments, the FPA combines SWIR and LWIR detection into a single FPA and/or single aperture camera.

In some embodiments, the colloidal quantum dot photodiode may have a broadband sensitivity from 200 to about 2400 nm and a flexible pixel size from about less than 3.0 μm×3.0 μm to 25 mm×25 mm.

In further embodiments, the multiband FPA may be free of Indium bumps and through vias.

Still further embodiments of the present inventive concept provide a method of fabricating a multiband focal plane array (FPA) including providing a readout integrated circuit (ROIC) substrate; forming a plurality of short wave infrared (SWIR) and long wave infrared (LWIR) pixels on the ROIC substrate; forming a microbolometer on the plurality of SWIR and LWIR pixels; and depositing a colloidal quantum dot photodiode on the SWIR pixels between the SWIR pixels and the microbolometer. The microbolometer is coupled to the LWIR pixels through metal contacts on the LWIR pixels.

In some embodiments of the present inventive concept, the method further includes forming the metal contacts on the ROIC substrate.

In further embodiments of the present inventive concept, providing the ROIC substrate may include providing a single silicon CMOS ROIC substrate.

In still further embodiments of the present inventive concept, the FPA may combine SWIR and LWIR detection into a single FPA and/or single aperture camera.

In further embodiments, the method does not include bump bonding, forming through InGaAs vias, InP polishing and planarization.

In still further embodiments, the method may further include removing CQD layers from microbolometer pixel contacts on the ROIC substrate.

BRIEF DESCRIPTION OF THE DRAWINGS

FIG. 2 is a Table (Table 1) illustrating an InGaAs Approach to Multiband FPAs.

FIG. 5 is a Table (Table 2) illustrating the CQD® approach to multiband FPAs in accordance with some embodiments of the present inventive concept.

DETAILED DESCRIPTION

Figure 1:
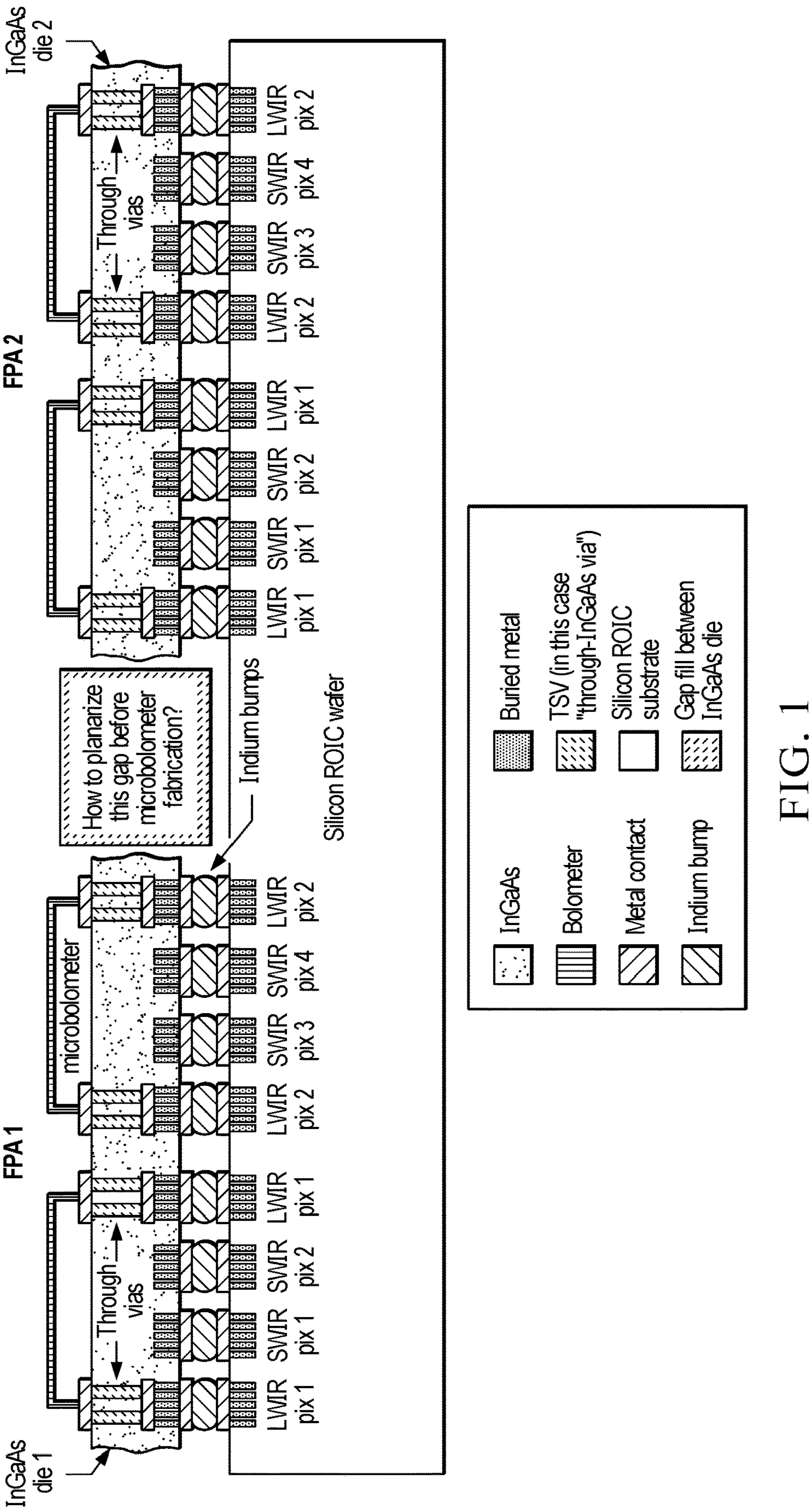
FIG. 1 (PRIOR ART)
FIG. 1 is a cross-section illustrating a four-pixel indium gallium arsenide (InGaAs)/InP detector die hybridized to a silicon readout wafer.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms “a”, “an” and “the” are intended to include the plural forms as well, unless the context clearly indicates otherwise. It will be further understood that the terms “comprises”, “comprising,” “includes” and/or “including” when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being “responsive” or “connected” to another element, it can be directly responsive or connected to the other element, or intervening elements may be present. In contrast, when an element is referred to as being “directly responsive” or “directly connected” to another element, there are no intervening elements present. As used herein the term “and/or” includes any and all combinations of one or more of the associated listed items and may be abbreviated as “/”.

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As used herein, the term “optoelectronic device” generally refers to any device that acts as an optical-to-electrical transducer or an electrical-to-optical transducer. Accordingly, the term “optoelectronic device” may refer to, for example, a photovoltaic (PV) device (e.g., a solar cell), a photodetector, a thermovoltaic cell, or electroluminescent (EL) devices such as light-emitting diodes (LEDs) and laser diodes (LDs). In a general sense, EL devices operate in the reverse of PV and photodetector devices. Electrons and holes are injected into the semiconductor region from the respective electrodes under the influence of an applied bias voltage. One of the semiconductor layers is selected for its light-emitting properties rather than light-absorbing properties. Radiative recombination of the injected electrons and holes causes the light emission in this layer. Many of the same types of materials employed in PV and photodetector devices may likewise be employed in EL devices, although layer thicknesses and other parameters must be adapted to achieve the different goal of the EL device.

As used herein, the term “quantum dot” or “QD” refers to a semiconductor nanocrystal material in which excitons are confined in all three spatial dimensions, as distinguished from quantum wires (quantum confinement in only two dimensions), quantum wells (quantum confinement in only one dimension), and bulk semiconductors (unconfined). Also, many optical, electrical and chemical properties of the quantum dot may be strongly dependent on its size, and hence such properties may be modified or tuned by controlling its size. A quantum dot may generally be characterized as a particle, the shape of which may be spheroidal, ellipsoidal, or other shape. The “size” of the quantum dot may refer to a dimension characteristic of its shape or an approximation of its shape, and thus may be a diameter, a major axis, a predominant length, etc. The size of a quantum dot is on the order of nanometers, i.e., generally ranging from 1.0-1000 nm, but more typically ranging from 1.0-100 nm, 1.0-20 nm or 1-10 nm. In a plurality or ensemble of quantum dots, the quantum dots may be characterized as having an average size. The size distribution of a plurality of quantum dots may or may not be monodisperse. The quantum dot may have a core-shell configuration, in which the core and the surrounding shell may have distinct compositions. The quantum dot may also include ligands attached to its outer surface or may be functionalized with other chemical moieties for a specific purpose.

Plasma synthesis has evolved to be one of the most popular gas-phase approaches for the production of quantum dots, especially those with covalent bonds. For example, silicon (Si) and germanium (Ge) quantum dots have been synthesized by using nonthermal plasma. The size, shape, surface and composition of quantum dots can all be controlled in nonthermal plasma. Doping that seems quite challenging for quantum dots has also been realized in plasma synthesis. Quantum dots synthesized by plasma are usually in the form of powder, for which surface modification may be carried out. This can lead to excellent dispersion of quantum dots in either organic solvents or water, i.e., colloidal quantum dots (CQD). Embodiments of the present inventive concept use CQD films as discussed below.

For purposes of the present disclosure, the spectral ranges or bands of electromagnetic radiation are generally taken as follows, with the understanding that adjacent spectral ranges or bands may be considered to overlap with each other to some degree: ultra-violate (UV) radiation may be considered as falling within the range of about 10-400 nm, although in practical applications (above vacuum) the range is about 200-400 nm. Visible radiation may be considered as falling within the range of about 380-760 nm. Infrared (IR) radiation may be considered as falling within the range of about 750-100,000 nm. IR radiation may also be considered in terms of sub-ranges, examples of which are as follows. Short wave infrared (SWIR) radiation may be considered as falling within the range of about 1,000-3,000 nm. Medium wave infrared (MWIR) radiation may be considered as falling within the range of about 3,000-5,000 nm. Long range infrared (LWIR) radiation may be considered as falling within the range of about 8,000-12,000 nm.

Quantum dot photodiode (QDP) technology is implemented to provide low-cost nanotechnology-enabled photodetectors. In some implementations, the photodetectors may be configured to efficiently detect light with sensitivity spanning a spectral region ranging from about 250-2400 nm. Thus, the photodetectors may be configured as a multispectral device capable of producing images from incident ultraviolet (UV), visible and/or infrared (IR) electromagnetic radiation. In some implementations, the spectral range of sensitivity may extend down to X-ray energies and/or up to IR wavelengths longer than 2400 nm. The photodetectors as taught herein are cost effective, scalable to large-area arrays, and applicable to flexible substrates.

As used herein, "quantum efficiency" (QE) refers to the (absorption) quantum efficiency with the optimal efficiency being one. In the case of Quantum well infrared photodetectors (QWIPs), absorption takes place only if the electric field vector of the radiation has a component perpendicular to the QW layer planes, which necessitates the angle of incidence with respect to these planes being different from zero.

"Dark current" refers to the residual electric current flowing in a photoelectric device when there is no incident illumination. In physics and in electronic engineering, dark current is the relatively small electric current that flows through photosensitive devices such as a photomultiplier tube, photodiode, or charge-coupled device even when no photons are entering the device. The dark current generally consists of the charges generated in the detector when no outside radiation is entering the detector. It can be referred to as reverse bias leakage current in non-optical devices and is present in all diodes. Physically, one source of dark current arises from the random generation of electrons and holes within the depletion region of the device.

SWIR Vision Systems' builds high-resolution sensors using colloidal quantum dot (CQD®) photodiodes sensitive across the spectral band from 400 to 2400 nm. CQD® technology provides the ability to image common designation lasers while simultaneously offering the benefits of high-pixel count imagers—including wide fields of view (FOV) and more pixels on target.

SWIR Vision Systems' thin-film photodiode array technology uses a colloidal quantum dot (CQD®) broadband absorber with a band gap that can be tuned across the spectral range from the near-infrared (NIR) to the extended shortwave infrared (eSWIR). Today, SWIR Vision Systems produces cameras with visible (Vis)-SWIR response from 400 to 1650 nm and Vis-eSWIR cameras which are sensitive from 350 to 2100 nm. Owing to the power of parallel processing (i.e. monolithic process on 8 or 12" Si CMOS ROICs), standard CMOS deposition and patterning techniques (e.g. sputter, evaporate, spin coat), and the mature colloidal quantum dots ecosystem for the quantum dot light emitting diode (QLED) display market, CQD® fabrication in accordance with embodiments discussed herein results in a straightforward path for fabricating SWIR and eSWIR FPAs at very high volumes and low cost.

Figure 3:
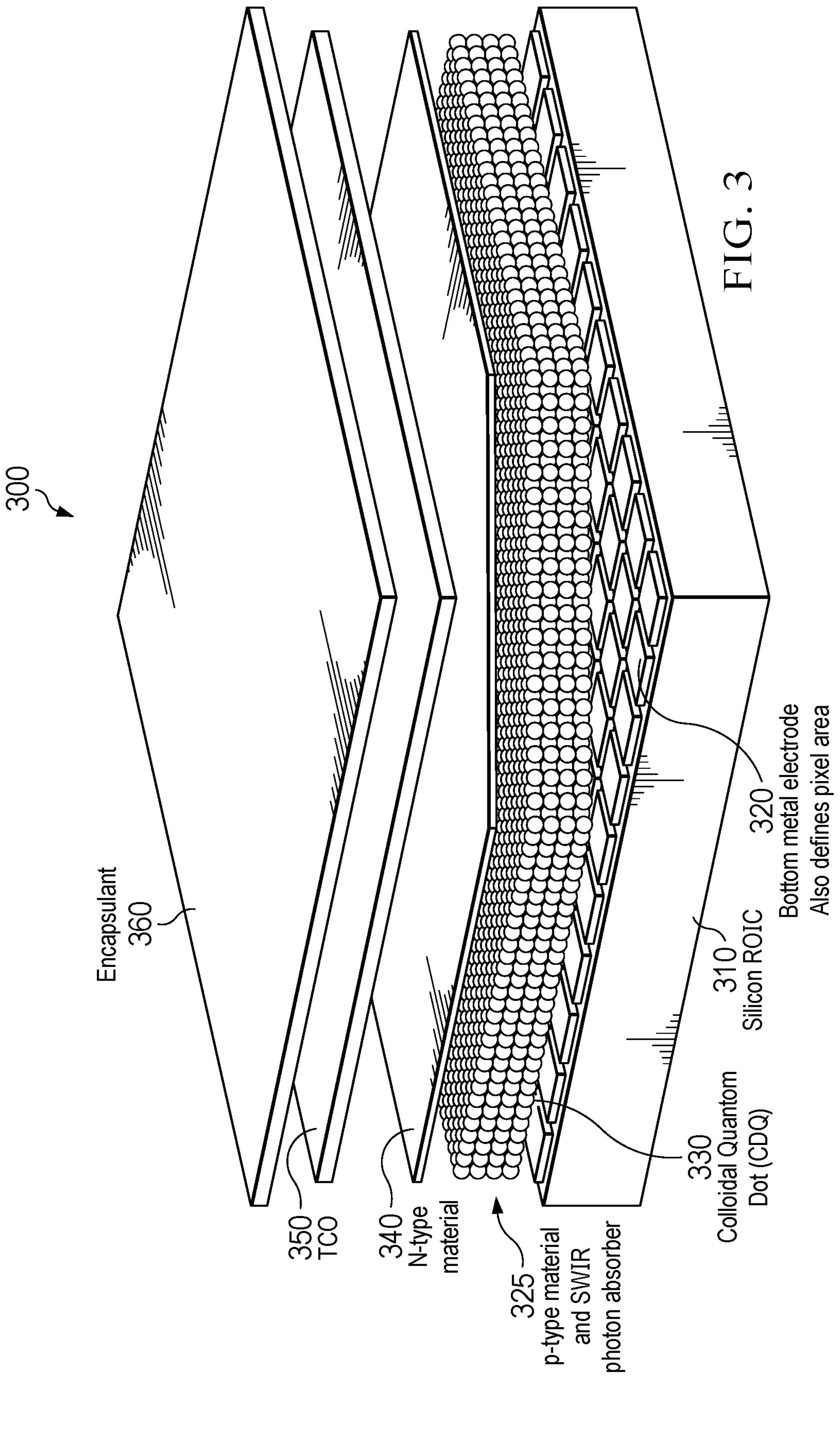
FIG. 3 is a cross-section illustrating a CQD® photodiode layer stack deposited on a surface of a readout integrated circuit (ROIC).

Referring first to FIG. 3, a cross-section illustrating an example colloidal quantum dot photodetector 300 in accordance with some embodiments of the present inventive concept will be discussed. As illustrated therein, the colloidal quantum dot photodetector 300 includes a ROIC 310, for example, a silicon ROIC, a metal electrode 320, a photo absorber 325, a colloidal quantum dot p-type material 330, an n-type material 340, a transparent conducting film (TCO) 350 and an encapsulant 360.

As illustrated, the CQD diode layer stack 330 is on the surface of the ROIC 310. In some embodiments, the CQD diode layer may be deposited on the ROIC 310. It will be understood that the cross-section illustrated in FIG. 3 is not to scale and is provided for example only. For example, in some embodiments a total thickness of the CQD photodiode 300 may be less than 1.0 μm. Although the CQD layer is discussed as being deposited herein, embodiments are not limited thereto.

As discussed in the background of the present inventive concept, combining short wave infrared (SWIR) and long-wave infrared (LWIR) detection capabilities into single focal plane array (FPA) and/or single aperture camera has been difficult. Accordingly, some embodiments of the present inventive concept provide a novel low-cost, uncooled, scalable, SWIR detector technology using colloidal quantum dots (CQDs). As stated above, sensors fabricated with the CQD photodiode have broadband sensitivity, for example, from 200 to about 2400 nm; flexible pixel size, for example, less than 3.0 μm×3.0 μm to 25 mm×25 mm detectors; and high resolution, for example, as large as one 8" wafer.

Figure 4:
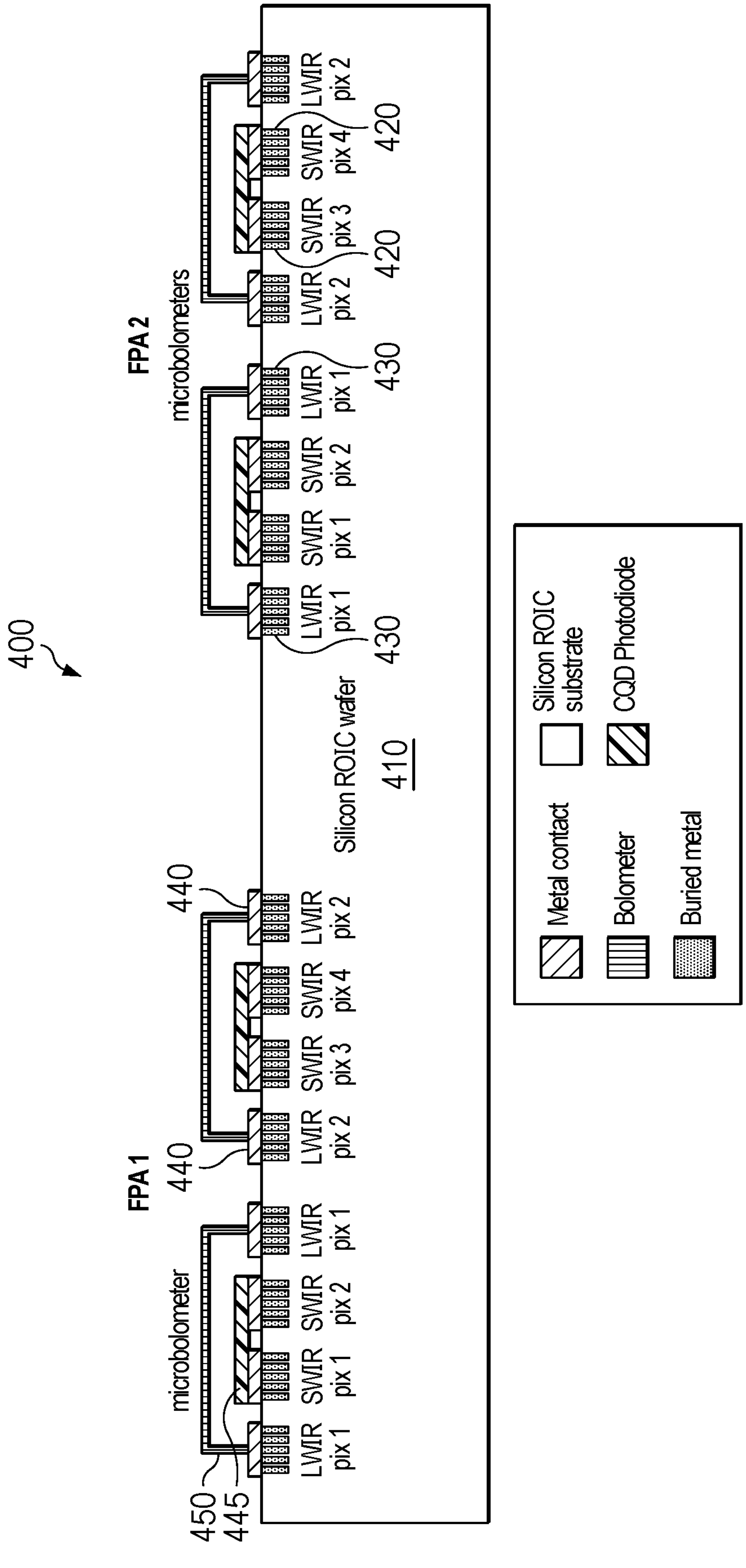
FIG. 4 is a cross-section of a four-pixel CQD® SWIR sensitive photodiode combined with a microbolometer on a single silicon CMOS ROIC in accordance with embodiments of the present inventive concept.

Referring now to FIG. 4, a cross-section of a four-pixel CQD® SWIR sensitive photodiode combined with a microbolometer on a single silicon CMOS ROIC in accordance with some embodiments of the present inventive concept will be discussed. As illustrated, the multiband focal plane array (FPA) 400 includes a readout integrated circuit (ROIC) substrate 410; a plurality of short wave infrared (SWIR) 420 and long wave infrared (LWIR) 430 pixels; metal contacts 440 on the LWIR pixels 430; a colloidal quantum dot photodiode 445 on the SWIR pixels 420; and a microbolometer 450 on the plurality of SWIR 420 and LWIR 430 pixels. As illustrated, the microbolometer 450 is coupled to the metal contacts 440 of the LWIR pixels 430 and the colloidal quantum dot photodiode 445 on the SWIR pixels is between the SWIR pixels 420 and the microbolometer 440.

In some embodiments, the ROIC substrate 410 is a single silicon CMOS ROIC substrate, however, embodiments are not limited thereto. Thus, the multiband FPA 400 combines SWIR and LWIR detection into a single FPA and/or single aperture camera. The FPA 400 has broadband sensitivity from 200 to about 2400 nm and a flexible pixel size from about less than 3.0 μm to 25 mm. As discussed further below, the multiband FPA 410 is free of Indium bumps and through vias and, thus, is more easily fabricated than the device in FIG. 1.

The detector fabrication is performed using the CQD process. As illustrated, for example, in FIG. 4, the CQD fabrication approach eliminates need for indium bump bonding (i.e. heterogenous hybridization), as well as the need for through InGaAs vias, InP polishing, and the planarization steps prior to microbolometer fabrication. The CQD photodiode structure is fabricated on top of the CMOS ROIC utilizing low cost materials and common, low cost processing tools. It will be understood that FIG. 4 is shown using four pixels for illustrative purposes only. In reality the number of pixels may be hundreds, thousands or millions of pixels per image sensor. Thus, embodiments of the present inventive concept are not limited to four pixels as shown.

A bolometer is a device that can measure the temperature of an object by detecting and measuring the object's emitted thermal photons. A microbolometer is a specific type of bolometer used as a detector in, for example, a thermal camera.

Thus, the resulting fabrication process for the Multiband SWIR/LWIR FPA is dramatically less complex and substantially lower cost than conventional processes. A microbolometer fabrication process can be used directly on top of the CQD photodiodes. SWIR Vision Systems' standard commercial CQD fabrication process can be used with the addition of one step. In the CQD fabrication approach, the CQD photodiode layers are only patterned/removed around the edge of the array to remove the material from the common cathode and bond pads (i.e. CQD layers are not patterned in the pixel array). In a multiband device in accordance with embodiments of the present inventive concept, the CQD layers are removed from the microbolometer pixel contacts on the silicon ROIC. This has been demonstrated using both traditional photolithography and subtractive etch techniques and laser ablation to pattern the CQD photodiode layers. The CQD film is relatively thin, for example, <500 nm, and is planarized by the first layer of polyimide deposited during microbolometer fabrication. This may reduce or, possibly eliminate, the need for TSVs and downstream modifications to the microbolometer fabrication process.

Another key concern for integrating SWIR/LWIR is the thermal compatibility between the processes. Embodiments of the present inventive concept provide significant improvements to the thermal budget of its photodiodes, demonstrating compatibility with a 200° C. solder reflow process. Based on understanding of the microbolometer fabrication process, 200° C. is approximately the maximum fabrication process temperature due to a similar thermal budget of the vanadium oxide layer.

Accordingly, some embodiments of the present inventive concept provide a CQD SWIR sensitive photodiode combined with a microbolometer on a single silicon CMOS ROIC. The complexity of the CQD is drastically reduced from the conventional device with the elimination of bump bonding, through InGaAs vias, and planarization. In the CQD approach, the CQD materials are deposited and patterned using previously established processes. The resulting CQD structure lends itself to the standard commercial microbolometer fabrication processes resulting in a low cost, low risk approach. Table 2 in FIG. 5 illustrates the details of the CQD approach to multiband FPAs.

As discussed above, embodiments of the present inventive concept combine standard CQD and microbolometer fabrication techniques to create low-cost multiband monolithic focal plane arrays. Some existing ROIC and electronic technology may be used to further decrease cost and fabrication complexity.

Multiband focal plane arrays in accordance with some embodiments of the present inventive concept may be used to offer CQD coating services to existing defense primes that fabricate microbolometer focal plane arrays (e.g. FLIR, DRS).

Embodiments of the present inventive concept may be used in combination with any product which would benefit from an uncooled, multiband (SWIR+LWIR) low SWAP-C focal plane array and/or camera. Owing to their low-cost monolithic fabrication approach and ability to detect warm objects of interest in both day and night, microbolometer enabled thermal imagers are ubiquitous. SWIR sensors uniquely enable laser spot detection, human identification, and daytime imaging through degraded visual environments (haze, fog, smoke, dust, etc.), but are not as ubiquitous primarily due to the high cost of the InGaAs detector fabrication process. The CQD® short wave infrared detector technology developed by SWIR Vision Systems (SVS), uses a unique SWIR detector fabrication approach that lends itself to the monolithic fabrication of SWIR and LWIR detectors on a single ROIC. The SVS approach can enable SWIR sensitivity to microbolometer thermal imagers at an incremental increase in cost, weight, size, and power.

Embodiments of the present inventive concept are described herein with reference to cross-section illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present inventive concept.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Furthermore, although various layers, sections and regions of the photodetector may be discussed as being p-type and/or n-type, it is understood by those of skill in the art that in many devices these conductivity types may be switched without effecting the functionality of the device. If an element, region or layer is referred to as "n-type" this means that the element, layer or region has been doped to a certain concentration with n-type dopants, for example, Si, Germanium (Ge) or Oxygen. If an element region or layer is referred to "p-type" this means that the element, region or layer has been doped with p-type dopants, for example, magnesium (Mg), Beryllium (Be), Zinc (Zn), Calcium (Ca) or Carbon (C). In some embodiments, an element, region or layer may be discussed as "$p^+$" or "$n^+$," which refers to a p-type or n-type element, region or layer having a higher doping concentration than the other p-type or n-type elements, regions or layers in the device. Finally, regions may be discussed as being epitaxial regions, implanted regions and the like. Although these regions may include the same material, the layer resulting from the various methods of formation may produce regions with different properties. In other words, an epitaxial grown region may have different properties than an implanted or deposited region of the same material.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

What is claimed is:

1. A multiband focal plane array (FPA) comprising:
- a readout integrated circuit (ROIC) substrate;
- a plurality of short wave infrared (SWIR) pixels and a plurality of long wave infrared (LWIR) pixels on the ROIC substrate;
- a microbolometer on the plurality of SWIR pixels and the plurality of LWIR pixels; and
- a colloidal quantum dot photodiode on the SWIR pixels between the SWIR pixels and the microbolometer, wherein the microbolometer is coupled to the plurality of LWIR pixels through metal contacts on each of the plurality of LWIR pixels.

2. The multiband FPA of claim 1, wherein the ROIC substrate is a single silicon CMOS ROIC substrate.

3. The multiband FPA of claim 1, wherein the FPA combines SWIR and LWIR detection into a single FPA and/or single aperture camera.

4. The multiband FPA of claim 1, wherein the FPA including the colloidal quantum dot photodiode has broadband sensitivity from 200 to about 2400 nm and a flexible pixel size from about less than 3.0 μm×3.0 μm to 25 mm×25 mm.

5. The multiband FPA of claim 1, wherein the multiband FPA is free of Indium bumps and through-vias.

6. A method of fabricating a multiband focal plane array (FPA) comprising:
- providing a readout integrated circuit (ROIC) substrate;
- forming a plurality of short wave infrared (SWIR) pixels and a plurality of long wave infrared (LWIR) pixels on the ROIC substrate;
- forming a microbolometer on the plurality of SWIR pixels and the plurality of LWIR pixels; and
- depositing a colloidal quantum dot photodiode on the SWIR pixels between the SWIR pixels and the microbolometer, wherein the microbolometer is coupled to the plurality of LWIR pixels through metal contacts on each of the plurality of LWIR pixels.

7. The method of claim 6, further comprising forming the metal contacts on the ROIC substrate.

8. The method of claim 6, wherein providing the ROIC substrate comprises providing a single silicon CMOS ROIC substrate.

9. The method of claim 6, wherein the FPA combines SWIR and LWIR detection into a single FPA and/or single aperture camera.

10. The method of claim 6, wherein the FPA including the colloidal quantum dot photodiode has broadband sensitivity from 200 to about 2400 nm and a flexible pixel size from about less than 3.0 μm×3.0 μm to 25 mm×25 mm.

11. The method of claim 6, wherein the method does not include bump bonding, forming through InGaAs vias, InP polishing and planarization.

12. The method of claim 6, further comprising removing CQD layers from microbolometer pixel contacts on the ROIC substrate.

13. The method of claim 6, wherein the colloidal quantum dot photodiode deposited on the SWIR pixels has a thickness of less than 500 nm and is planarized by a first layer of polyimide deposited during formation of the microbolometer.

14. The multiband FPA of claim 1, wherein the colloidal quantum dot photodiode deposited on the SWIR pixels is planarized by a first layer of polyimide.

15. A multiband focal plane array (FPA) comprising:
- a readout integrated circuit (ROIC) substrate;
- a plurality of short wave infrared (SWIR) pixels and a plurality of long wave infrared (LWIR) pixels on the ROIC substrate;
- a microbolometer on the plurality of SWIR pixels and the plurality of LWIR pixels; and
- a colloidal quantum dot photodiode on the SWIR pixels between the SWIR pixels and the microbolometer, wherein the colloidal quantum dot photodiode has a thickness of less than 500 nm, and wherein the microbolometer is coupled to the plurality of LWIR pixels through metal contacts on each of the plurality of LWIR pixels.

16. The multiband FPA of claim 15, wherein the ROIC substrate is a single silicon CMOS ROIC substrate.

17. The multiband FPA of claim 15, wherein the FPA combines SWIR and LWIR detection into a single FPA and/or single aperture camera.

18. The multiband FPA of claim 15, wherein the FPA including the colloidal quantum dot photodiode has broadband sensitivity from 200 to about 2400 nm and a flexible pixel size from about less than 3.0 μm×3.0 μm to 25 mm×25 mm.

19. The multiband FPA of claim 15, wherein the multiband FPA is free of Indium bumps and through-vias.

20. The multiband FPA of claim 15, wherein the colloidal quantum dot photodiode deposited on the SWIR pixels is planarized by a first layer of polyimide.

* * * * *